US005706783A

United States Patent [19]

Sawada

[11] Patent Number: 5,706,783

[45] Date of Patent: Jan. 13, 1998

[54] ENGINE CONTROL ARRANGEMENT

[75] Inventor: Yuichiro Sawada, Iwata, Japan

[73] Assignee: Yamaha Hatsudoki Kabushiki Kaisha, Iwata, Japan

[21] Appl. No.: 702,889

[22] Filed: Aug. 26, 1996

[30] Foreign Application Priority Data

Aug. 25, 1995 [JP] Japan .................................... 7-217193

[51] Int. Cl.[6] .............................. F02D 43/04; H05K 7/06

[52] U.S. Cl. ......................... 123/417; 123/54.4; 123/480; 361/736

[58] Field of Search .................................. 123/54.4–54.8, 123/417, 478, 480; 361/728, 736, 748, 752; 364/431.052, 431.053

[56] References Cited

U.S. PATENT DOCUMENTS 3,996,914 12/1976 Crall et al. .......................... 123/198 E
4,409,641 10/1983 Jakob et al. ............................ 361/720
4,606,315 8/1986 Tobinaga et al. ........................ 123/417
4,762,105 8/1988 Beyer et al. ............................ 123/417
5,608,632 3/1997 White .................................. 123/417 X

*Primary Examiner*—Tony M. Argenbright
*Attorney, Agent, or Firm*—Knobbe, Martens, Olson & Bear LLP

[57] ABSTRACT

An improved fuel injection and ignition control system for an engine, wherein the fuel injectors and ignition are controlled by respective circuits mounted on a common substrate but spaced from each other. The assembly is potted in a resin for electrical and heat insulation. The resulting control box can easily be mounted in the valley of a V-type engine in the powerhead of an outboard motor.

6 Claims, 15 Drawing Sheets

ENGINE CONTROL ARRANGEMENT

BACKGROUND OF THE INVENTION

This invention relates to an engine control system and more particularly to an improved engine control system particularly adapted for compact engine construction, such as those utilized in outboard motors.

In the interest of obtaining a better engine performance in terms of output and driveability, it has been proposed to employ electronic control systems. In addition to achieving these goals, proper electronic control systems can also improve the fuel economy of the engine and, furthermore, improve engine exhaust emission control. When coupled with such features as electronic spark control systems and electrically operated fuel injection systems, such arrangements can be very effective.

Also, these systems frequently employ so-called "feedback control" wherein the combustion conditions in the combustion chamber are monitored and finite adjustments made to the spark timing, fuel injection timing and fuel injection amount to obtain the desired performance. Frequently, a device known as a oxygen ($O_2$) sensor is employed for these feedback controls. The $O_2$ sensor is placed in the exhaust system and by measuring the amount of oxygen in the exhaust gases, can accurately determine the fuel air ratio.

As noted, these types of systems can be quite effective in achieving their desired goals. However, the use of electronic systems and the numerous sensors-and control circuits employed for them greatly complicate the electrical system for the engine. In addition, because of the high voltage utilized to fire the spark plugs and the fact that the system frequently operates to control the charging of a battery from the alternator or generator of the engine, the systems can be quite prone to disrupted or improper performance because of electrical noise.

These problems are particularly acute where the engine is confined to a very compact area. Such is particularly true in connection with outboard motors. In an outboard motor, as is well known, the engine is contained primarily, if not entirely, in a powerhead at the upper portion of the outboard motor and is surrounded by a protective cowling. Hence, the space for the electronic controls are quite limited and, thus, the previously proposed devices can be subject to adverse operation caused by noise in the overall outboard motor arrangement.

It is, therefore, a principal object of this invention to prove and improved electronic control for an internal combustion engine.

It is a further object of this invention to provide an electronic control for an internal combustion engine that is less sensitive to external noise It is a further object of this invention to provide an improved electronic control for the engine of an outboard motor.

It is a still further object of this invention to provide an improved and compact electronic control for the spark ignition and fuel injection system of an engine and, particularly, a multiple cylinder engine.

SUMMARY OF THE INVENTION

This invention is adapted to be embodied in an engine control system for an internal combustion engine having at least one spark plug and one electronically operated fuel injector. The control system includes a printed circuit board or substrate on which fuel injection control and ignition control circuits are mounted. These circuits are potted in a resin and are disposed at spaced locations from each other on the printed circuit board so as to avoid thermal and electrical interference from each other. Wire connectors are fed to and from the various circuits in spaced relationship from each other so as to avoid electrical interference.

DETAILED DESCRIPTION OF THE PREFERRED EMBODIMENT OF THE INVENTION

Figure 1:
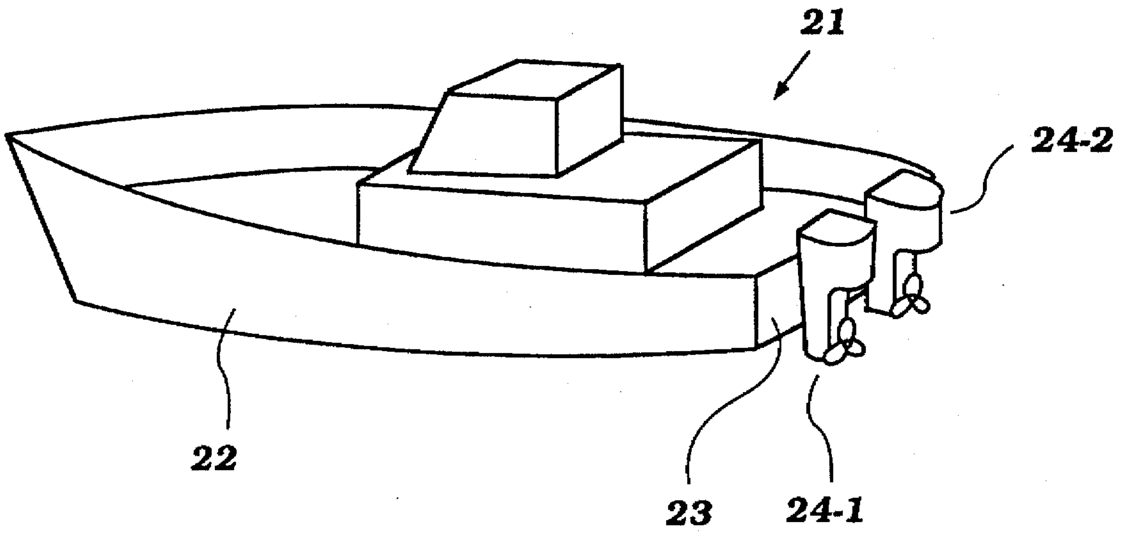
FIG. 1 is a rear, side perspective view of a watercraft powered by a propulsion system having a control constructed in accordance with an embodiment of the invention.

Referring now in detail to the drawings and initially to FIG. 1, a watercraft constructed and propelled by a propulsion system that is operated and constructed in accordance with an embodiment of the invention is identified generally by the reference numeral 21. Although the invention is described in conjunction with a watercraft such as the watercraft 21, it will be readily apparent to those skilled in the art from the following description, as well as from the foregoing remarks, that the invention is directed primarily to the control for the propulsion system of the watercraft 21.

For this reason and since the control system is not limited to any particular engine or engine type or use for the engine, an application to a watercraft, such as the watercraft 21, is utilized only to enable to those skilled in the art to understand how the invention can be utilized. Those skilled in the art will readily understand how the invention can be utilized in conjunction with any of a wide variety of types of internal combustion engines as well as loads operated by those engines. However the invention has particular utility with marine propulsion systems, for reasons already discussed.

To continue, the watercraft 21 includes a hull 22 which has a transom 23 upon which a pair of outboard motor propulsion devices 24-1 and 24-2 are mounted. The invention is described in conjunction with an application embodying dual propulsion devices because, as will become apparent, certain facets of the control system have utility in conjunction with arrangements wherein there are such dual propulsion devices. For the foregoing reasons, however, those skilled in the art will readily understand how the invention can be employed with engine applications utilizing only one engine.

Figure 2:
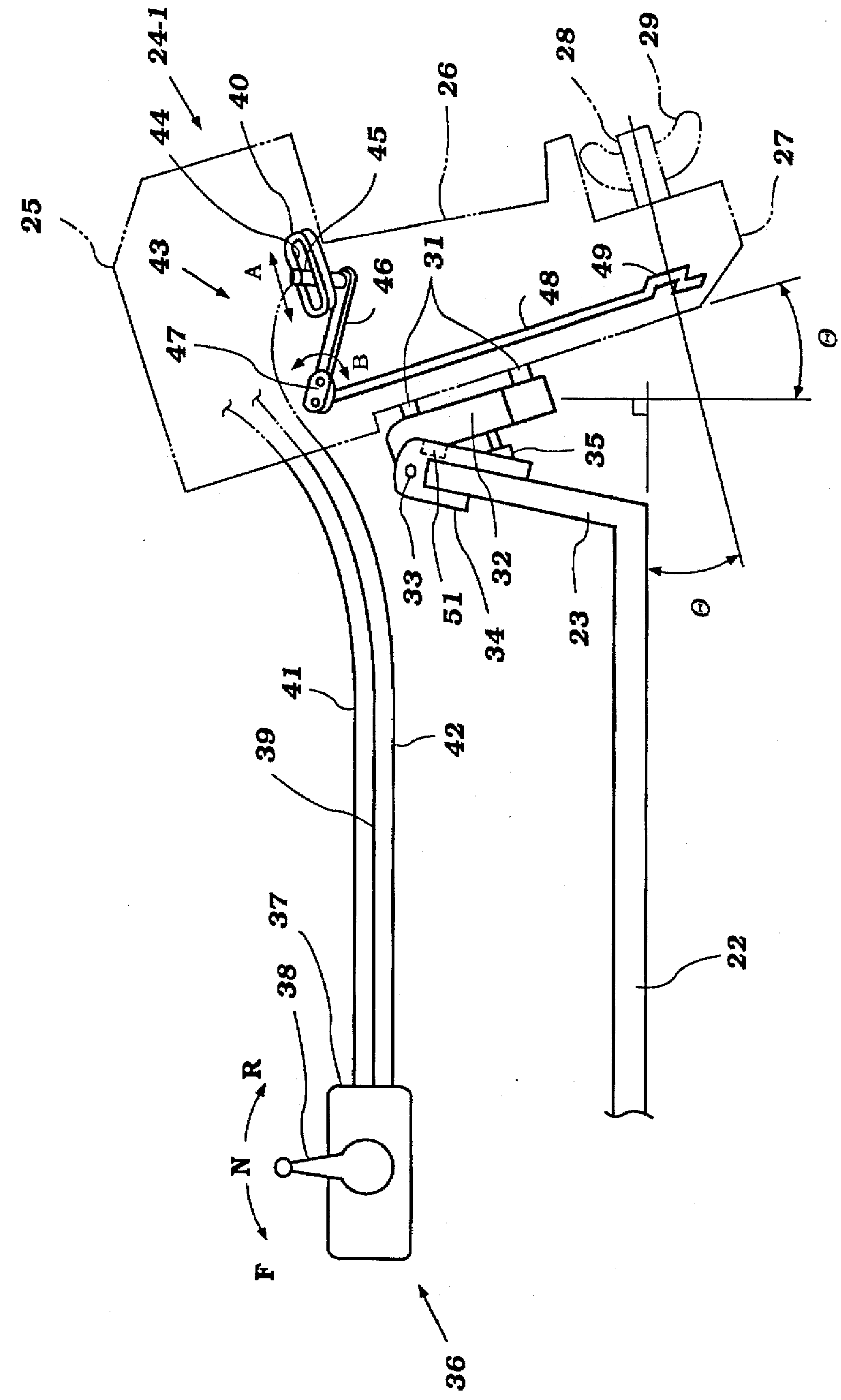
FIG. 2 is a side elevational view of a portion of the watercraft and specifically of one of the propulsion devices and its operator controls.

As has been noted, the propulsion devices 24-1 and 24-2 are outboard motors and these motors are shown in more detail in FIG. 2 wherein their attachment to the transom 23 of the watercraft 22 is also shown in more detail. As has also been noted, the invention has particular utility with outboard motors where space is at a premium and where electrical noise in the control systems is a significant problem.

Each outboard motor includes a powerhead, shown in phantom and indicated by the reference numeral 25. This powerhead contains a powering internal combustion engine which, as previously noted, may be of any known type or configuration. In the exemplary embodiment that will be described, this engine is of the V-6 two-cycle crankcase compression type. For the reasons already noted, the invention can be utilized with a wide variety of types of engines other than that specifically described.

As is typical with outboard motor practice, the engine in the powerhead 25 is mounted so that its output shaft or crankshaft rotates about a vertically extending axis. This facilitates connection to a drive shaft (not shown) that depends into and is rotatably journaled in a drive shaft housing 26.

Referring particularly to FIG. 2, this drive shaft continues on to a lower unit 27 in which a forward neutral reverse transmission of a known, bevel gear type, is positioned. This transmission drives a propeller hub 28 from which propeller blades 29 extend in a known manner. In applications employing dual outboard motors as described, each propeller 29 preferably rotates in a direction opposite to the other during both the forward and reverse drive modes.

Each outboard motor has a steering shaft affixed, as by brackets 31, to its drive shaft housing 26 in a known manner. These steering shafts are journaled for rotational movement about a vertically extending steering axis in a respective swivel bracket 32. The swivel bracket 32 is, in turn, pivotally connected by means of a pivot pin 33 to a clamping bracket 34. The pivotal connection provided by the pivot pin 33 permits tilt and trim movement of the outboard motors 24 as is well known in this art.

A hydraulic motor and shock absorbing assembly, indicated generally by the reference numeral 35, is interposed between the transom 23 of the watercraft and the outboard motors 24 for accomplishing controlled tilt and trim movement. These hydraulic motors 35 also may include shock absorbing mechanisms which permit the outboard motors 24 to pop when underwater obstacles are struck.

The clamping brackets 34 incorporate clamping mechanisms for attaching them to the transom 23 of the hull 22 in a well known manner.

As has been noted, the outboard motors 24 include a transmission which permits shifting between a forward, neutral and reverse position. In addition, the engine of the powerhead 25 is provided with some form of engine speed control which may constitute one or more throttle valves (as will be described by reference to FIG. 3) of the engine.

As is typical with marine practice, a single lever control, indicated generally by the reference numeral 36 may be mounted in the hull 22 at a position convenient to the operator and spaced from the transom 23. The single lever control 36 includes a base assembly 37 and an operator-controlled lever 38. The lever 38 is connected by a first set of bowden wire actuators 39 and 41 to the engine speed control. In addition, a connection is provided by a bowden wire actuator 42 to a transmission shift control, shown in part in perspective view in this figure and indicated generally by the reference numeral 43.

As those skilled in this art will readily understand, the single lever control 38 is movable between a neutral position indicated at N to a forward drive position F or a reverse drive position R. Generally, the way the system operates is that the single control lever 38 is movable through a first range from its neutral position to either the forward or reverse drive positions wherein the transmission, operated through the linkage system which will be described, moves from its neutral to its forward or reverse drive positions. After engagement of the clutches of the transmission has occurred, continued movement of the lever 38 will cause the throttle or engine speed controls to continue to open to permit increase in the engine's speed.

Although the throttle control is not shown in detail because it is conventional, a portion of the transmission control is shown although that also is conventional. This transmission control includes a control lever 40 which is pivotally supported within the powerhead 25 and which defines a cam groove 44 in which a follower pin 45 is received. The follower pin 45 is mounted at one end of a shift control lever 46 which is connected by a coupling 47 to a shift control rod 48. The shift control rod 48 has a crank arm 49 at its lower end that cooperates with a suitable mechanism for effecting the operation of the transmission in the lower unit 27. Again, this mechanism is generally of the type known in the art and, since this mechanism forms no significant part of the invention, a further description of it is not believed to be necessary to permit those skilled in the art to practice the invention.

Figure 3:
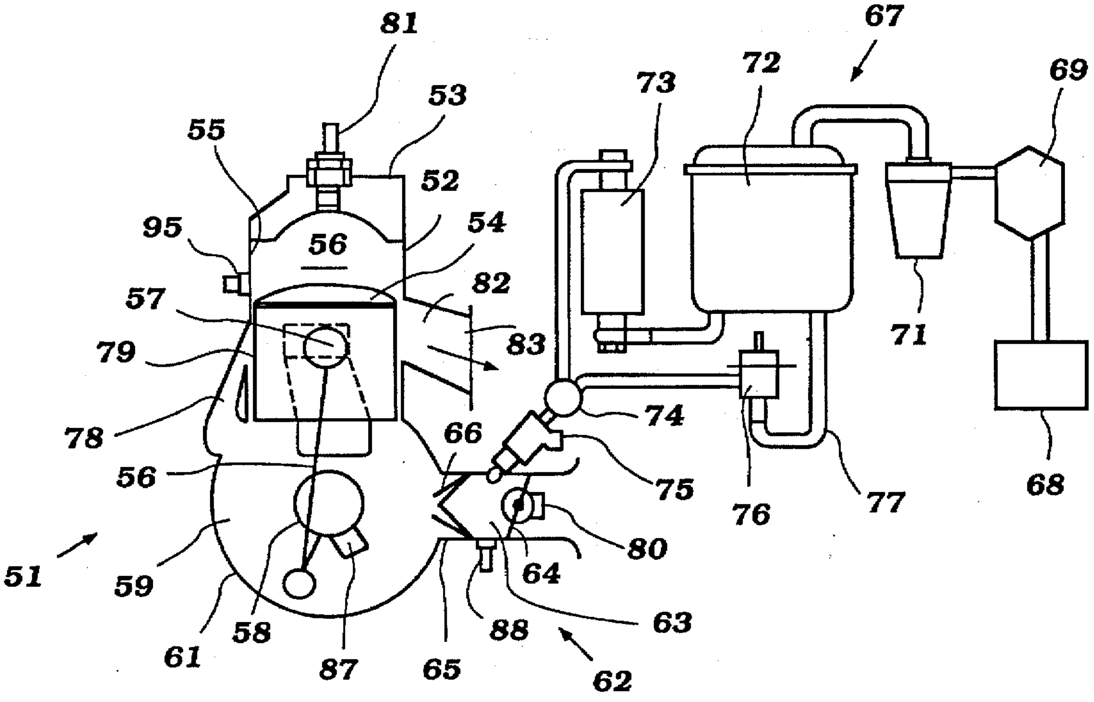
FIG. 3 is a partially schematic, cross sectional view of the engine of the one propulsion units taken through one of its cylinders and showing the fuel supply system in part.

Referring now primarily to FIG. 3, a portion of the engine of the powerhead 25 is depicted and is identified generally by the reference numeral 51. The engine 51, as has been previously noted, is in a preferred embodiment a two-cycle engine having a V-6 configuration. Such engines are normally used as propulsion units in outboard motors and for this reason a two-cycle engine of this configuration is described. In fact, however, FIG. 3 only shows a single cylinder of the engine but it will be readily apparent to those skilled in the art how the invention can be practiced with engines having other cylinder numbers and other cylinder configurations. Also, although the invention is described in conjunction with a two-cycle engine, it should be apparent to those skilled in the art that the invention can also be utilized with four-cycle engines.

It should also be recognized that the following description of the engine 51 is only to permit those skilled in the art to understand the general environment in which the invention can be utilized. Therefore, where any details of the engine 51 or its supporting components are either not illustrated or are illustrated only schematically, reference may be had to any construction known in the art.

The engine 51 includes a cylinder block 52 that is closed by a cylinder head 53 that is affixed thereto in a known manner. A piston 54 reciprocates in a cylinder bore 55 of the cylinder block and defines with the cylinder bore 55 and the cylinder head 53 a combustion chamber 56. The piston 54 is connected to the small end of a connecting rod 56 by means of a piston pin 57. The big end of the connecting rod 56 is journaled on a throw of a crankshaft 58.

The crankshaft 58 is journaled for rotation in a crankcase chamber 59 that is formed by the cylinder block 52 and more specifically by a skirt thereof and a crankcase member 61 that is affixed to the cylinder block skirt in a known manner. As has been noted and as is typical with outboard motor practice, the engine 51 is mounted so that the rotation axis of the crankshaft 58 is in a vertical orientation.

Since the engine 51 in the described embodiment operates on a two-cycle crankcase compression principle, the crankcase chambers 59 associated with each of the cylinder bores 55 are sealed from each other in a known manner.

An air induction system, indicated generally by the reference numeral 62 is provided for delivering an air charge to the combustion chambers 56 through the crankcase chambers 59. This induction system includes an air inlet device that draws atmospheric air from within the protective cowling of the powerhead in a well known manner.

This air is then delivered to a throttle body 63 in which a throttle valve 64 is rotatably journaled. This air then flows to intake ports 65 formed in the crankcase chamber 59. Reed-type check valves 66 are provided in these intake ports 65 so as to permit a charge to flow into the crankcase chambers 59 but which act to prevent reverse flow when the pistons 54 are moving downwardly to compress the charge in the crankcase chambers 59.

Fuel is mixed with the air in the throttle body 63 and is supplied by a fuel supply system, indicated generally by the reference numeral 67. This fuel supply system 67 includes a fuel tank 68 which is mounted in the hull 22 of the watercraft. A low-pressure pump 69, which may be driven by the engine 51 in a known manner, draws fuel from this remote tank 68 through a suitable conduit and passes it through a filter 71. The fuel then enters a fuel vapor separator 72 which functions to remove fuel vapors and air from the fuel so as to prevent vapor lock and intermittent fuel injection.

A high pressure pump 73 draws fuel from the fuel vapor separator 72 and delivers it to a fuel rail 74. Although the fuel pump 73 is shown in a separate location, in actual practice the high-pressure fuel pump 73 may be actually contained within the body of the fuel vapor separator 72.

The fuel rail 74 supplies fuel to a plurality of fuel injectors 75, one for each combustion chamber of the engine. The fuel injectors 75 are mounted preferably in the throttle body 63 and spray fuel downstream of the throttle valve 64 toward the reed-type check valve 66.

Fuel is maintained at the desired pressure in the fuel rail 74 by a pressure regulator 76. The pressure regulator 76 maintains the desired pressure by dumping excess fuel back to the fuel supply system, for example, to the vapor separator 72 through a return conduit 77.

The fuel and air which is thus delivered to the crankcase chambers 59 is then transferred to the combustion chambers 56 through one or more scavenge passages 78 that extend from the crankcase chambers 59 to the cylinder bores 55 where they end in scavenge ports 79. This charge is then further compressed in the combustion chamber 56. At an appropriate time interval, as will be described, this charge is ignited by one of a plurality of spark plugs 81 that are mounted in the cylinder head 53 and each of which has its gap disposed in a respective one of the combustion chambers 56.

The charge bums and expands and then eventually opens an exhaust port 82 formed in the cylinder bore 55 and which communicates with an exhaust system shown partially and schematically and indicated by the reference numeral 83. As is typical with outboard motor practice, this exhaust system may discharge under high-speed/high-load conditions through an underwater exhaust gas discharge which may be formed in the hub 28 of the propeller 29. In addition, an above-the-water, more restricted low-speed exhaust gas discharge may also be provided, as is well known in this art.

Since the back pressure on the engine can affect the engine performance, the outboard motor 24 is provided with a trim angle sensor, indicated schematically by the reference numeral 84 which measures the angles θ between the steering shaft and a vertical as shown in FIG. 2. This angular measurement by the trim angle sensor 84 is utilized in engine control, as will be described.

In connection with the basic engine control, there are certain types of sensors which may be incorporated and, although the engine is not shown in detail, those skilled in the art will readily understand the type of sensors which are described and those which are available in the art and which may be utilized to practice the invention. In addition to the trim sensor 84 described, additional sensors may be employed.

This basic engine control will now be described by primary reference to FIGS. 2 through 4 wherein the various sensors are shown in a schematic fashion. Even though the showing and description is schematic, those skilled in the art will readily understand how to practice the invention in conjunction with actual physical embodiments.

The control includes an ECU 85 controls a capacitor discharge ignition circuit and the firing of spark plugs 81. The spark plugs 81 and other components of the system which are associated with a particular cylinder of the engine have their reference characters noted with a suffix showing the specific cylinder number.

In addition, the ECU controls the engine fuel injectors 75 so as to control both the beginning and duration of fuel injection and the regulated fuel pressure, as already noted. The ECU 85 operates on a strategy for the spark control and fuel injection control as will be described. This system employs an exhaust sensor assembly indicated generally by the reference numeral 86. This sensor is preferably an oxygen ($O_2$) sensor of any known type.

The sensors employed further include a crankshaft position sensor 87 which senses the angular position of the engine crankshaft and also the speed of its rotation. A crankcase pressure sensor may also provided for sensing the pressure in the individual crankcase chambers. Among other things, this crankcase pressure signal may be employed as a means for measuring intake air flow and, accordingly, controlling the amount of fuel injected by the injectors 75, as well as their timing.

An air temperature sensor 88 may be provided in the intake passage downstream of the engine throttle valves 64 for sensing the temperature of the intake air. In addition, the position of the throttle valves is sensed by a throttle position sensor 89.

In accordance with some portions of the control strategy, it may also be desirable to be able to sense the condition of the described transmission for driving the propeller 29 or at least when it is shifted into or out of neutral. Thus, a transmission condition sensor 91 is mounted in the powerhead and cooperates with the shift control mechanism for providing the appropriate indication.

As noted, the trim angle sensor 84 is provided for sensing the angular position of the swivel bracket 32 relative to the clamping bracket 34. This signal can be utilized to determine the exhaust back pressure.

Figure 4:
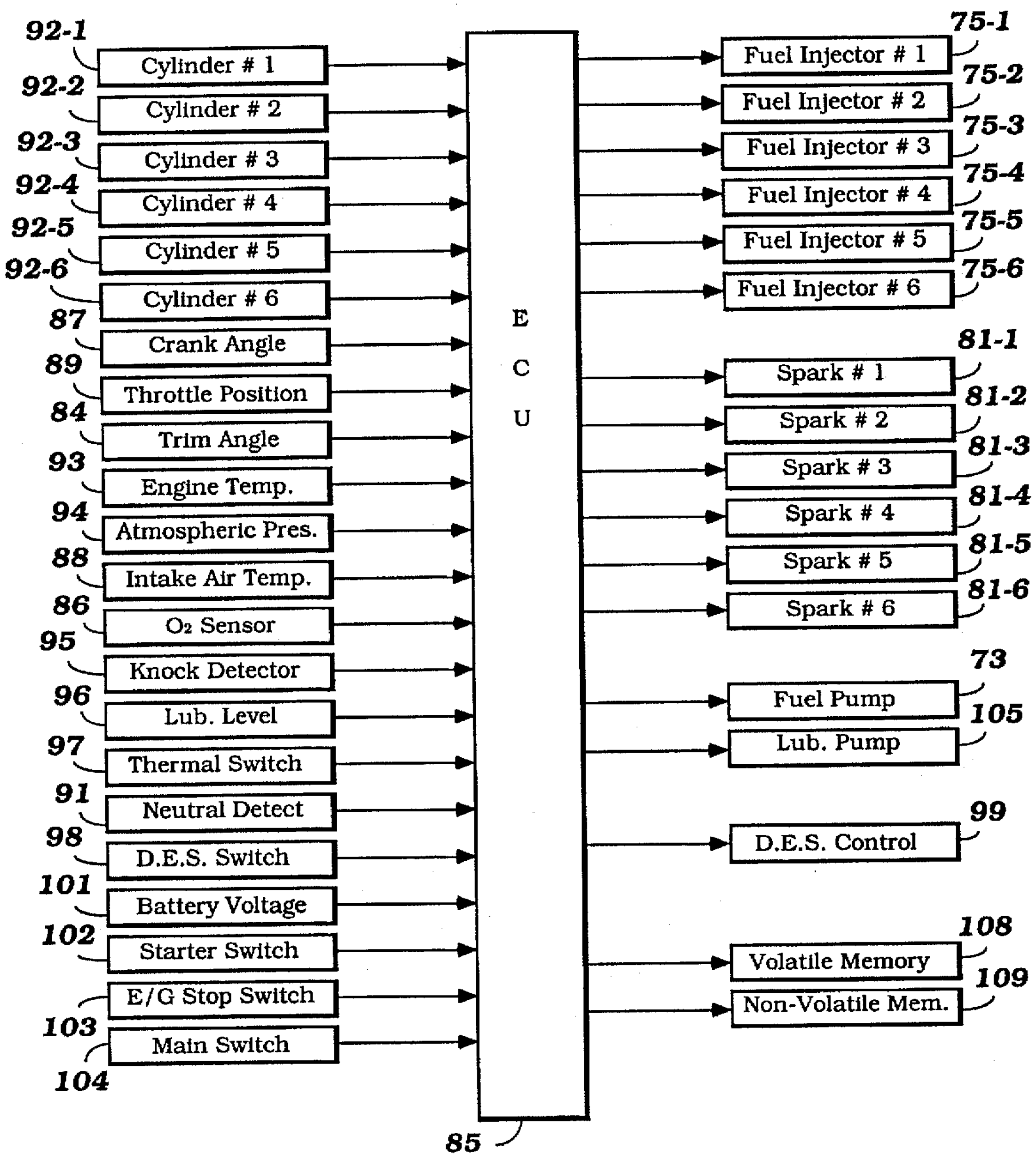
FIG. 4 is a diagrammatic view showing the relationship of the various detectors of the propulsion unit controls to the ECU and the relationship of the ECU to certain controlled portions of the engine, specifically the fuel injectors, ignition system, fuel pump, and oil pump.

Continuing to refer primarily to FIG. 4, this shows the ECU 85 and its input and output signals which includes the output signals to the fuel injectors 75 and the spark plugs 81 for controlling the time of beginning of injection of each of the fuel injectors 75, the duration of injection thereof and also the timing of firing of the spark plugs 81.

Certain of the detectors for the engine control have already been described and these include the oxygen sensor 86, the crank angle sensor 87, the intake air temperature sensor 88, the throttle position detector 89, the transmission neutral detector switch 91 and the trim angle sensor 84. In addition, each cylinder is provided with a respective detector 92 which is associated with the crankshaft and indicates when the respective cylinder is in a specific crank angle. This may be such a position as bottom dead center (BDC) or top dead center (TDC). These sensors cooperate along with the basic crank provide position sensor 87 and provide indications when the respective cylinders are in certain positions, as noted.

There is also provided an engine temperature sensor 93 which is mounted in an appropriate body of the engine and which senses its temperature. As will become apparent, the output of the engine temperature sensor 93 may be utilized also to detect when the engine is in an over-heat mode and initiate protective action so as to permit the engine to continue to operate, but restrict its speed if an over-temperature condition exists. This speed limitation may be accomplished by disabling the operation of one or more of the engine cylinders. As will also become apparent, the actual cylinder which is disabled may be changed during this protective running mode so that all cylinders will fire at least some times, but certain cylinders will be skipped during one or more cycles. This will ensure against plug fouling, etc. during this protective mode.

There is also provided an atmospheric air pressure detector 94 that provides a signal indicative of atmospheric air pressure for engine control.

The engine may also be provided with a knock detector 95, which appears schematically in FIGS. 3 and 4 and which outputs a signal when an knocking condition is encountered. Any appropriate control may be utilized for minimizing knocking, such as changing spark timing and/or fuel injection amount and timing as will also be discussed later.

The engine may be provided with a separate lubricating system that includes a lubricate tank. Thus there may be provided a lubricant level detector 96 that also provides a signal indicative of when the lubricant level is below a predetermined value. Like overheat conditions, this low lubricant level may be employed as a warning and the engine speed can be limited when the lubricant level, as sensed by the sensor 96, falls below a predetermined level. Any well known system for accomplishing this can be provided.

In addition to the engine temperature sensor 93, there may be also provided a thermal switch 97 that can be set to signal when an over-temperature condition exists as opposed to utilizing the output of the engine temperature sensor 93.

In applications where there are two outboard motors 24 mounted on the transom 23 of the same watercraft, as illustrated, if an abnormal conditions exists in one of these outboard motors and its speed is limited in the aforenoted manner, it is also desirable to ensure that the other outboard motor also has its speed limited. This improves directional control. There have been disclosed in the prior art various arrangements for providing this interrelated control and such a control is indicated schematically as 98 and is referred to as a DES (Dual Engine System) detector. This is a crossover circuit, indicated schematically at 99, which provides the signal for engine speed control to be transmitted to the normally operating engine as well as to the abnormally operating engine for the aforenoted reasons.

In addition to the actual engine and transmission condition detectors there may also be provided detectors that detect the condition of certain controls and auxiliaries such as a battery voltage detector 101, a starter switch detector 102 associated with a starter switch which controls an engine starter motor (not shown) and an engine stop or kill switch detector 103.

If battery voltage is below a predetermined value, certain corrective factors may be taken. Also, when the engine starter switch is actuated as indicated by the starter switch detector 102, the program can be reset so as to indicate that a new engine cycle of operation will be occurring. The engine stop switch detector 103 is utilized so as to provide a shutdown control for stopping of the engine which also may be of any known type. There is also provided a main switch 104.

In addition to those inputs noted, various other ambient engine or related inputs may be supplied to the ECU 85 for the engine management system.

The ECU 85 also is provided with a memory that is comprised of a volatile memory 108 and a nonvolatile memory 109. The volatile memory 108 may be employed for providing certain learning functions for the control routine. The nonvolatile memory 109 may contain maps for control during certain phases of non-feedback control, in accordance with the invention. The ECU 85 also controls, in addition to the fuel injectors 75 and the firing of the spark plugs 81, the high pressure fuel pump 73 and the lubricating pump which has been referred to but which has not been illustrated in detail. This lubricating pump is shown schematically at 105 in FIG. 4. Obviously, those skilled in the art will understand how these various controls cooperate with the components of the engine to provide their control, as will become apparent.

Figure 5:
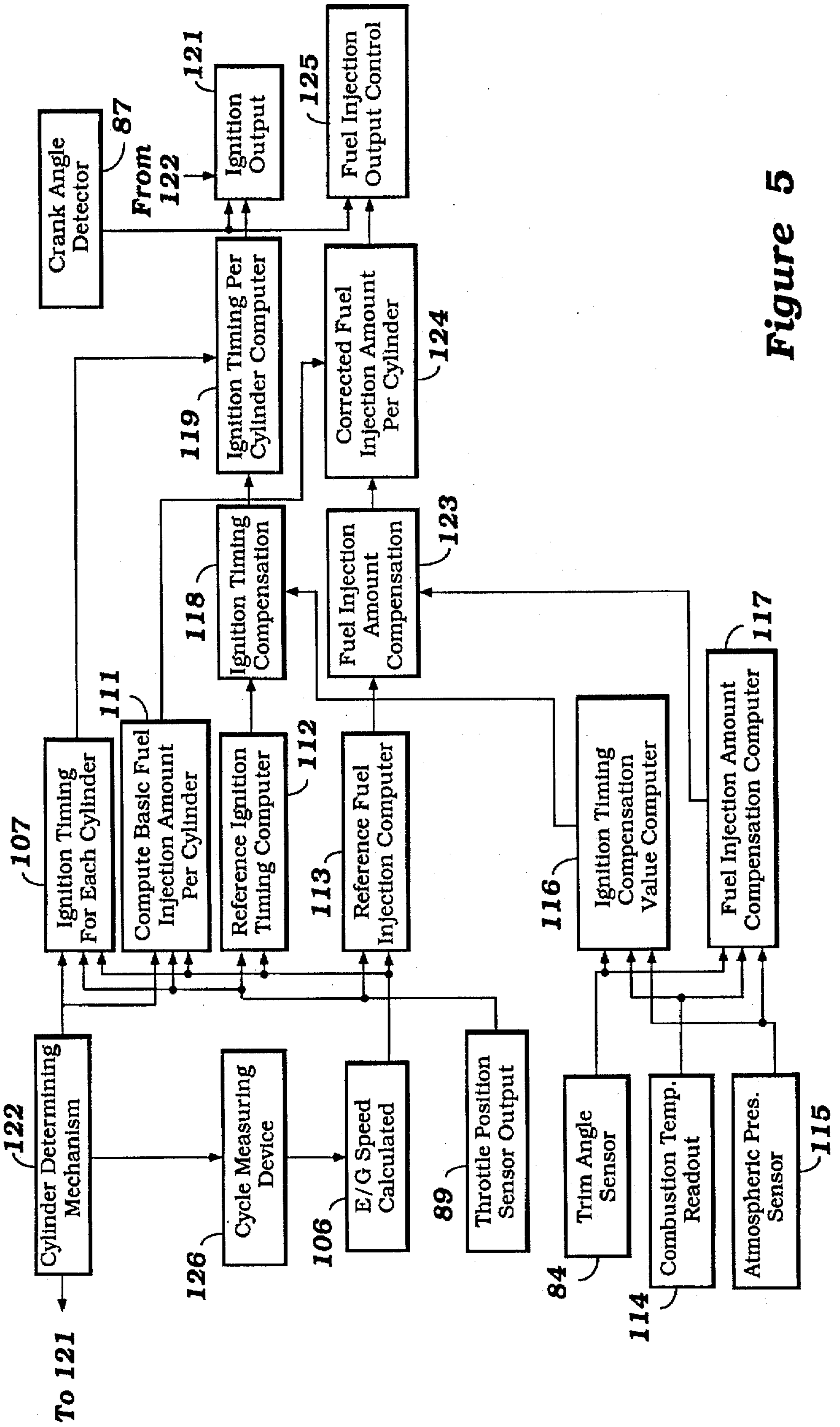
FIG. 5 is a further block diagram showing how the various detectors are interrelated to the various computing portions of the ECU and the outputs to the ignition and fuel controls.

Referring now to FIG. 5, this figure illustrates certain of the sensor outputs previously referred to and particularly in connection with FIG. 4 and the various sections of the ECU 85 and how they interrelate with each other so as to provide the basic fuel injection and ignition controls. This figure is obviously schematic and does not show all of the interconnections between the various sensors and control sections of the ECU 85. However, this figure is useful in permitting those skilled in the art to understand how the systems are interrelated before the actual control sequence will be described. FIG. 5 also shows primarily the method and apparatus by which the determination of the basic fuel injection timing and amount and ignition timing are determined.

Referring now specifically to this figure, the system includes a first section wherein the basic ignition timing, fuel injection timing and duration are computed. These basic timings and amounts are made from measuring certain engine parameters such as engine speed and load. In this embodiment, engine speed, calculated at the section 106, is determined by counting the number of pulses from the crank angle sensor 87 in a unit of time. In addition to providing the signal indicative of crank angle, by summing the number of pulses from the sensor 87 in a given time interval it will be possible to determine the actual engine rotational speed.

In addition to measuring the engine speed in order to obtain the basic control parameters, the engine load is also measured. This is done by utilizing the output of the throttle position sensor 89 although various other factors which determine the load on the engine can be utilized.

The outputs from the engine speed determination and throttle opening or load are sent to a number of calculating sections in the ECU 85. These include a section 107 that computes the ignition timing for each cylinder. This information is derived from an appropriate map such as may be reserved in the aforenoted nonvolatile memory 109 and is based upon the time before or after top dead center for each cylinder. By taking this timing and comparing it with the actual crankshaft rotation, the appropriate timing for all cylinders can be calculated.

In addition, the basic maps aforereferred to also contain an amount of fuel required for each cylinder for the sensed engine running conditions. This is in essence a basic fuel injection amount computation made in a section 111. This computation may be based either on fuel volume or duration of injection timing. Air flow volume and other factors may be employed to set the basic fuel injection amount.

The outputs from the engine speed calculation 106 and engine load or throttle position sensor 89 are also transmitted to a reference ignition timing computer 112 and a reference fuel injection computer 113. In addition to the outputs of the basic engine condition sensors (speed and load in the described embodiment) there are also other external factors which will determine the optimum basic fuel injection timing duration and ignition timing. These may include among the other things, the trim angle of the outboard motor as determined by the trim angle sensor 84 and the actual combustion temperature as indicated by a sensor indicated schematically at 114. Furthermore, the atmospheric or barometric pressure, all previously referred to also is significant and this is read by an appropriate sensor 115.

The outputs from these sensors 84 and 114 are transmitted to an ignition timing compensation computer section 116 and a fuel injection amount compensating computer 117. These compensation factors are determined also based upon known value maps programmed into the ECU 85.

The outputs from the reference ignition timing computer 112 and the compensation value computer 116 are transmitted to an ignition timing compensating circuit 118. This then outputs a signal to the ignition timing per cylinder compensating circuit 119 which receives also signals from the unit 107 that sets the ignition timing for each cylinder. This then determines the appropriate timing for the ignition output from a driver circuit 121 for firing the individual spark plugs 81.

The crank angle detector 87 also is utilized to determine the appropriate ignition timing as is the output from a cylinder determination means, indicated generally by the reference numeral 122 and which determines, in a way which will be described, which individual cylinder is to be fired, depending upon the angular position of the crankshaft.

A similar system is employed for the fuel injection volume control. That is, a section 123 receives the reference fuel injection amount signal from the section 113 and the compensation amount from the section 117 and processes a corrected fuel injection amount. This is then transmitted to the section 124 which also receives the basic fuel injection amount per cylinder calculation from the section 111 to determine the corrected fuel injection amount per cylinder. This amount is then output to a fuel injector control circuit 125 which again receives the signals from the crank angle detector and cylinder determinator to supply the appropriate amounts of fuel to each cylinder by controlling the duration of opening of the fuel injector.

Timing for the beginning of injection may also be controlled in a like manner. The system also includes a cycle measuring arrangement 126 which determines the actual cycle of operation as will also be described later.

Figure 6:
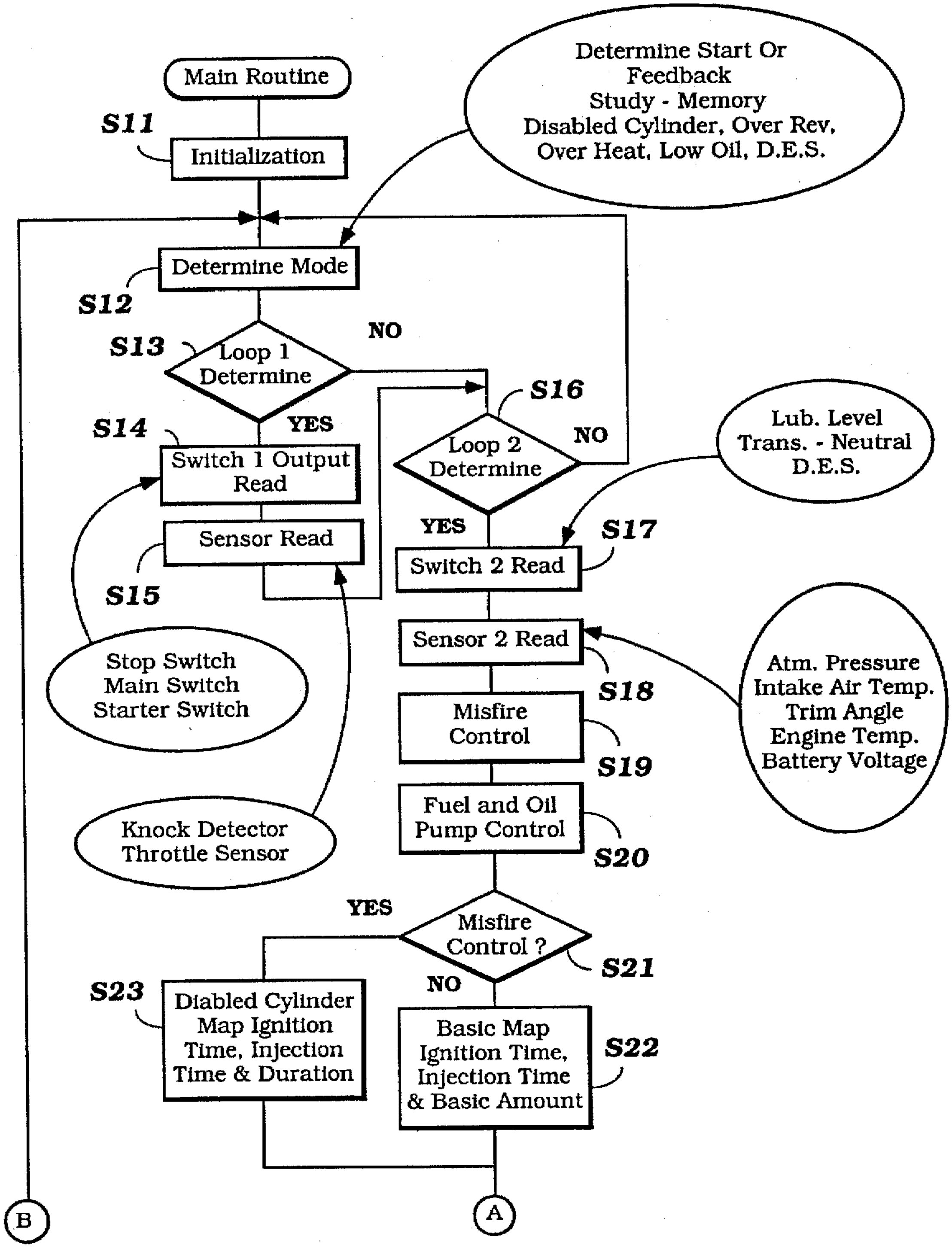
FIG. 6 is a partial block diagram showing the initial portion of the main control routine wherein the system provides the control depending upon whether or not a cylinder is disabled to slow the engine speed because of an encountered abnormality that could cause engine damage if not controlled.

A basic control routine by which the actual fuel injection timing mount and ignition timing may be determined will now be described beginning by reference to FIG. 6 and carrying on to those figures which follow it. As will become apparent the invention deals primarily with the physical construction of the control system and its mounting on the engine 51. Therefore, the following description should be considered as representative of only one basic concept which operates primarily to set a basic fuel injection amount and timing determined by engine speed and load as aforenoted. Those skilled in the art will understand from the following description how the invention can be practiced with a wide variety of types of ignition and fuel injection controls. This also includes non feed back systems. Of course the more complicated the control, the greater value the invention has.

Once the system is operating and the oxygen sensor 86 is at its operating temperature, the system shifts to a feedback control system. This feedback control system is superimposed upon the basic fuel injection amount and timing and spark timing so as to more quickly bring the engine to the desired running condition.

The output or combustion condition in one combustion chamber only is sensed and that signal is employed for controlling the other cylinders. In addition, there are some times when cylinders are disabled to reduce the speed of the engine for protection, as has also been noted. This system ensures proper control also during these times even if the disabled cylinder is the one with which the sensor is associated.

The control routine will now be described initially by reference to FIG. 6 with the discussion continuing onto the remaining figures where necessary. The program starts and goes to the step S 11 where the system is initialized. The program then moves to the step S12 wherein the ECU 85 determines the operational mode. This operational mode may be of one of many types such as starting, normal running and stop and is based upon primarily the results of the inputs from the sensors as shown in FIG. 4.

As noted the available modes include a start-up mode when the engine is first started. As previously noted, there is a starter switch 102 and, when the starter switch has been initiated and the program has just begun, the ECU 85 will assume the starting mode and go into the appropriate control routine for that starting mode. This start up mode of operation will employ neither feedback control nor necessarily sensing of engine running conditions, but rather set the appropriate parameters for engine starting and/or warm-up.

Another potential mode is the operation when a cylinder or more is being disabled to effect speed control and protection for a so-called "limp home" mode. This mode will be described later by reference to certain of the remaining figures and is based upon the sensing of other conditions which will now be also mentioned.

The disabling of cylinders to protect the engine may occur in response to the sensing of a number of critical features. One of these features is if the engine is operating at too high a speed or an over-rev condition. Another condition is if the engine temperature is too high or is approaching a high level where there may be a problem. Another feature, as has been noted, is if there is a low oil level in the oil reservoir. A still further condition is if there is a dual engine system and one of the engines experiences one of the aforenoted conditions and, thus, both engines will be slow even though one engine may not require this.

Having determined the operational mode at the step S12, the program moves to the step S13 to determine which of the two time programs or control loops are presently occurring. The system is provided with two separate control loops: loop 1, which repeats more frequently than the other loop (loop 2). The timing for loop 1 may be 4 milliseconds and the timing for loop 2 may be 8 milliseconds. These alternative control loops are utilized so as to minimize the memory requirements and loading on the ECU 85.

Figure 8:
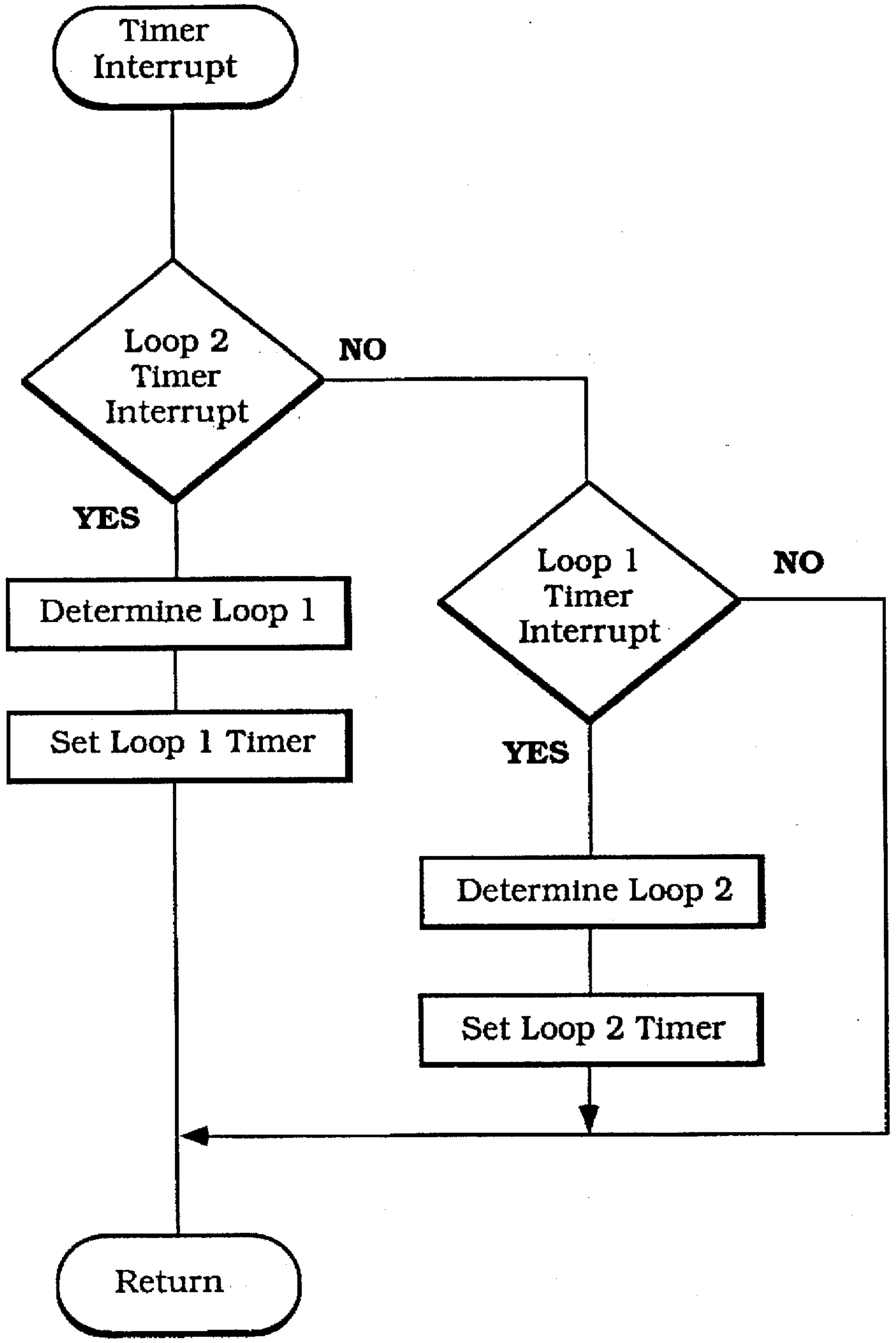
FIG. 8 is a block diagram showing the control routine of the timer interrupt sequence of operation.

FIG. 8 shows how the system determines which control loop the program is operating on. As may be seen in this figure, it begins when the timer is interrupted and then moves to the first step to determine if loop 2 timer has been interrupted. If it has not, the program moves to a step to determine if the loop 1 timer has been interrupted. If it has not, the program then returns. If, however, it is determined that the loop 1 timer has been interrupted, then the program moves to the next step to determine that the system is operating on loop 2 and then moves to set the timer for loop 2.

If, however, at the first step it is determined that the loop 2 timer has been interrupted, then the program moves to the next step to determine that loop 1 is being run and the program move to the next step to set loop 1 timer. Regardless of which timer is set, the program then returns.

Assuming that the loop 1 mode has been determined at the step S13, the program moves to the step S14, first to read the output of certain switches. These switches may include the main engine stop or kill switch 103, the main switch for the entire circuit 104 or the starter switch 102. The purpose for reading these switches is to determine whether the engine is in the starting mode or in a stopping or stopped mode so as to provide information when returning to the step S12 to determine the proper control mode for the ECU 85 to execute.

Having read the switches at the step S14, the program moves to the step S15 so as to read certain engine switch conditions which may determine the necessary mode. These switches may include, for example, the output from the knock detector 95 and/or the output from the throttle position sensor 89.

If loop 1 is not being performed at the step S13 or if it and the steps S14 and S15 have been completed, the program moves to the step S16 to determine if the time has run so as to initiate the loop 2 control routine. If the time has not run, the program repeats back to the step S12.

If the system is operating in the loop 2 mode of determination, the program then moves to the step S17 to read the output from certain additional switches. These switches can constitute the lubricant level switch 96, the neutral detector switch 91 and the DES output switch 98 to determine if any of these specific control routines conditions are required.

Having read the second series switches at S17, the program then moves to the step S18 to read the outputs from additional sensors to those read at the step S15. These sensors include the atmospheric air pressure sensor 94, the intake air temperature from the sensor 88, the trim angle from the trim angle sensor 84, the engine temperature from the engine temperature sensor 93 and the battery voltage from the battery sensor 101.

The program then moves to the step S19 to determine if cylinder firing disabling is required from the outputs of the sensors already taken at the steps S17 and/or S18. The program then moves to the step S20 so as to provide the necessary fuel pump and oil pump control.

The program then moves to the step S21 to determine if the system should be operating under normal control or misfire control. If no misfire control is required because none of the engine protection conditions are required, then the program moves to the step S22 to determine from the basic map the computation of the ignition timing, injection timing and amount of injection per cylinder. As has been previously noted, this may be determined from engine speed and engine load with engine load being determined by throttle valve position. This basic map is contained in the nonvolatile memory 109 of the ECU 85 as previously noted.

If at the step S21 it is determined that the program requires misfire or speed control by eliminating the firing of one cylinder, the program moves to the step S23 to determine from a further map, referred to as a disabled cylinder map, the ignition timing and injection timing and duration. This map is also programmed into the nonvolatile memory 109 of the ECU 85 from predetermined data and is based upon the fact that the engine will be running on a lesser than total number of cylinders.

Figure 7:
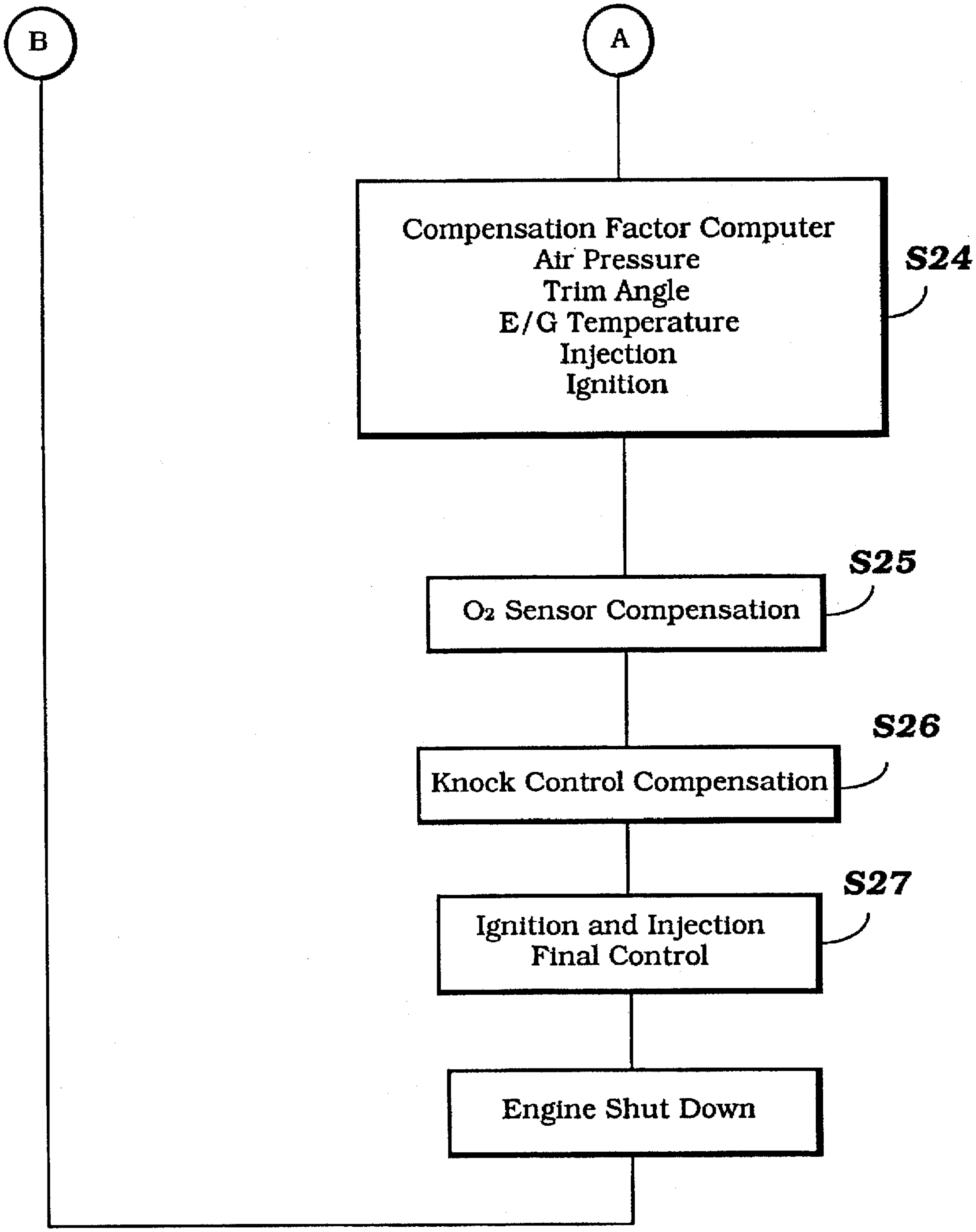
FIG. 7 is a partial block diagram of the remainder of the control routine shown in FIG. 6.

Once the basic ignition timing and injection timing and amount are determined at the appropriate steps S22 or S23, the program then moves to the step S24 (See now FIG. 7) so as to compute certain compensation factors for ignition and/or injection timing. These compensations are the same as those compensations which have been indicated as being made at the sections 118 and 119 and 123 and 124 of FIG. 5.

These compensation factors may include such outputs as the altitude pressure compensation, trim angle compensation and engine temperature compensation determined by the outputs from the sensors 94, 84, and 93, respectively. In addition, there may be compensation for invalid injection time and ignition delay made at the step S24.

The program then moves to the step S25 to determine if the engine is operating under oxygen feedback control and to make the necessary feedback control compensations based upon the output of the oxygen sensor 86.

The program then moves to the step S26 to determine if the output from the knock sensor 95 requires knock control compensation which may include either adjustments of spark timing and/or fuel injection amount. The program then moves to the step S27 so as to determine the final ignition timing injection timing and amount.

Another phase of the control routine will now be described by reference to FIG. 9. This phase has to do with the timing information primarily and certain procedure associated with the cylinder disabling mode for engine speed reduction and protection. The program begins when the timing sensor 87 indicates that the crankshaft is at top dead center. The program then moves to the step S28 to determine which cylinder it is that is at top dead center. This is done by utilizing the outputs of the cylinder position detectors 92.

The program then moves to the step S29 to ascertain from the order of approach of the cylinders to top dead center whether the engine is rotating in a forward or a reverse direction. It should be noted that, particularly on start-up, there is a possibility that the engine may actually begin to run in a reverse direction. This is a characteristic which is peculiar to two-cycle engines because of their inherent cycle operation.

If at the step S29 it is determined that the engine is rotating in a reverse direction, the program moves to the step S33 so as to initiate engine stopping. This may be done by ceasing the ignition and/or discontinuing the supply of fuel.

If at the step S29, however, it has been determined that the engine is rotating in the proper, forward direction, the program moves to the step S30 to measure the cycle of operation of the engine and then to the step S31 so as to actually compute the engine speed from the number of pulses from the crank position sensor 87 in relation to time, as previously noted. The program moves to the step S32 to determine if the engine speed is more than a predetermined speed. If the engine speed is too low, the program again proceeds to the step S33 where the engine is stopped.

If the engine continues to be operated, the program moves the step S34 to determine if the immediately detected cylinder is cylinder number 1. Cylinder number 1 is the cylinder with which the oxygen sensor 86 is associated. If the cylinder number 1 has not been the one that is detected, the program skips ahead to the point which will be discussed below.

If, however, it is determined at the step S34 that cylinder number 1 is the cylinder that is being immediately sensed, the program then moves to the step S35 to determine if the engine is operating in a cylinder disabling move. If it is not, the program moves to the step S36 so as to clear the register of the disabling information because the engine is now operating under a normal condition.

If, however, at the step S35 it is determined that the system is operating in the disabled cylinder mode so as to reduce or control maximum engine speed, the program moves to the step S37 to determine if the pattern by which the cylinder is disabled should be changed. As has been previously referred to, if the engine is being operated with one or more cylinders disabled so as to limit engine speed for the limp home mode, it is desirable to only disable a given cylinder for a predetermined number of cycles. If the disabling is extended, then on returning to normal operation the spark plug in the disabled cylinder may be fowled and normal operation will not be possible or will be very rough.

Thus, at the step S37 it is determined that the cylinder disabled has been disabled for a time period where it should be returned to operation, the program moves to the step S38. In the step S38, the disabling of the cylinder is switched from one cylinder to another in accordance with a desired pattern.

If it is not time to change the disabled cylinder at the step S37 or if the disabled cylinder number is changed at the step S38, the program then moves to the step S39 so as to set up or update the information as to the cylinder which is being disabled and the ignition disabling for that cylinder. The program then moves to the step S40 so as to actually step up the ignition pulse for the disabled cylinder and ensure that the cylinder will not fire. The program then moves to the step S41 so as to also ensure that the disabled cylinder will not receive fuel from the fuel injection. Then at the step S42, the disabling of injection pulse for the cylinder is also initiated. The program then moves to return.

Figure 9:
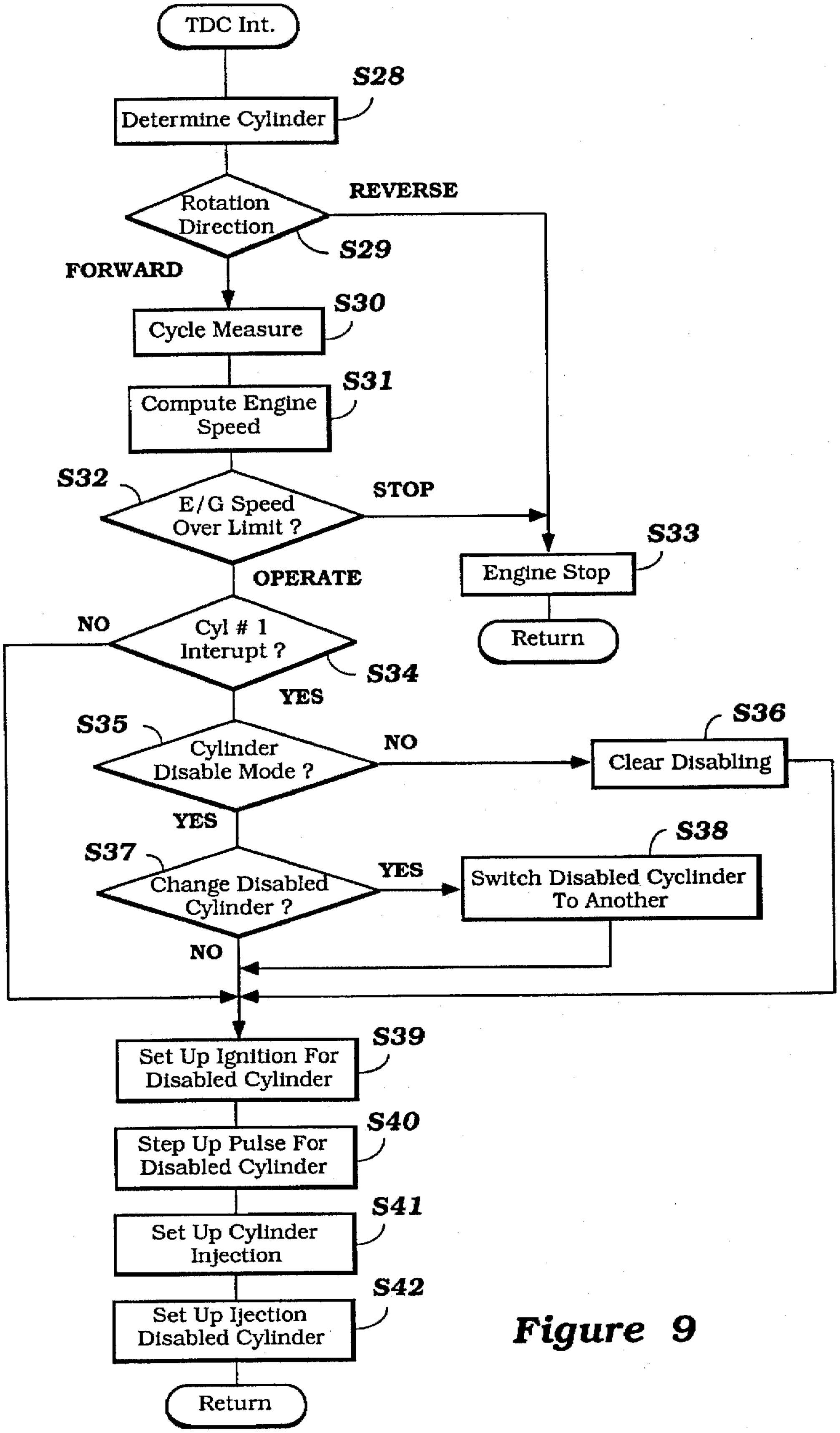
FIG. 9 is a further block diagram showing a further portion of the control routine including the condition when one cylinder is disabled to control or limit the engine speed.
Figure 10:
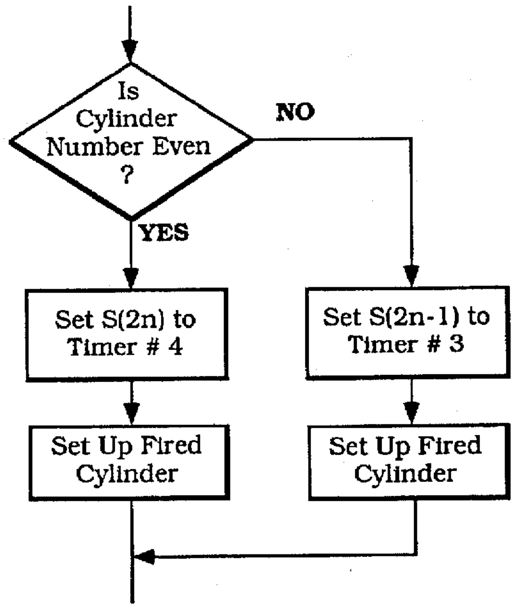
FIG. 10 is a block diagram showing a further portion of the control routine shown in FIG. 9 in sensing the respective cylinders.

FIG. 10 is a detailed subroutine that shows how the ignition pulse for the disabled cylinder at the step S40 in FIG. 9 is determined. In order to minimize the memory requirements and to permit faster computer Operation, the system is provided with two timers, one associated with those cylinder numbers that are even, and one that is associated with those cylinder numbers that are odd (Timers #3 and #4). This cylinder number is based upon the firing order. Those skilled in the art will understand the advantages of using the two timers rather than a single timer. In the specific example, the engine is a V-6, as has been noted, and, therefore, the firing of the cylinders is at an equal 60° angle. The cylinders in one bank are even numbered while those in the other bank are odd numbered.

Timer number 3 is utilized for odd-numbered cylinders while timer number 4 is used for even-numbered cylinders. Hence, when the program initially begins to set up the ignition pulse for the cylinder at the step S4, it is determined at the initial step if the cylinder number to be controlled is an even number or an odd number. If it is an odd number, the program moves to the right-hand side so as to set the timer for cylinder number 3 to be equivalent to the determine cylinder times 2 minus 1, that is, S is (2n−1) for the timer. From this, then the timing for the next cylinder number on the odd sequence is set from this information.

On the other hand, if the cylinder number is even, the timer number 4 is utilized and the timing for the next cylinder is set as 2n. The program then moves to the next step so as to set up the appropriate ignition timing for this.

Figure 11:
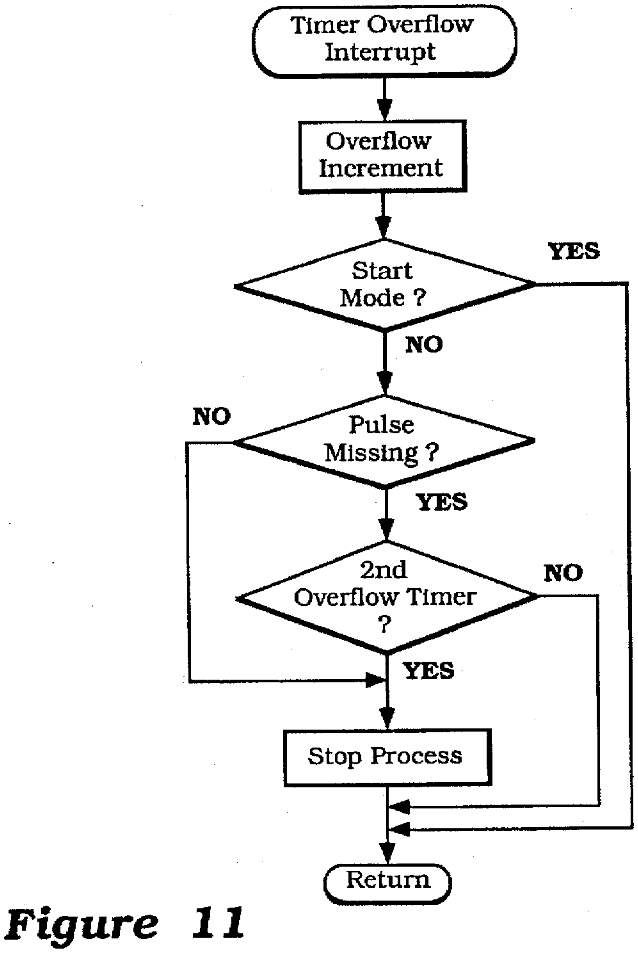
FIG. 11 is a block diagram showing a portion of the control for shut down utilized in FIG. 9.

FIG. 11 shows a control routine that is employed so as to stop the engine if the engine is running too slow. This is an explanation of the control routine which takes place basically in steps S30-S32 of FIG. 9.

If the engine is permitted to run at a speed that is too slow, the plugs will eventually foul and the engine will stall. If the engine is permitted to continue to run until its stalls, then restarting or resumption to normal operation will be difficult. Therefore, when the ECU 85 determines by the control routine of FIG. 11 that the engine is running too slow and fouling will occur to cause stalling, the engine is shut down before that occurs. There is, therefore, set a timer which counts the time between successive ignition pulses. And thus, at the first step in this figure, the timer overflow interruption is set and in the next step it is determined if the time between successive pulses is excessive because of an overflow of the timer then the program moves to a step to determine if the engine is in the original starting mode.

The reason it is determined if the engine is in original starting mode is that during initial engine starting the speed of the engine will be lower than the normal stalling speed at least initially. Thus, it is desirable not to effect stopping of the engine if the engine is in the original start-up mode because the engine would never be started otherwise. Thus, if it is determined at the start mode step of FIG. 11 that the engine is in the starting mode, the program jumps to the return.

If, however, it is determined that the engine is not in a starting mode, then the program moves to the next step to determine if a pulse has been missed. If a pulse has not been missed, as would be the case if there was a cylinder disabling for reducing the speed, then it is determined that the time interval is too long and the program immediately jumps to the step where the stopping process of the engine is initiated. Engine stopping is accomplished by discontinuing the firing of the ignition for all cylinders and/or the supply of fuel to all cylinders.

If, however, a pulse has been missed it may be because of the fact that the next successive cylinder is one which is not being fired in any event. Then the program moves to another step where the time between pulses is determined to be twice the normal pulse interval so as to accommodate a skipped cylinder. Thus, if the firing between two cylinders exceeds the time interval between 120° plus a time factor at this step, then it is assumed that the engine is running too slow and the program again initiates the stop process so as to stop running the engine and prevent plug fowling.

Figure 12:
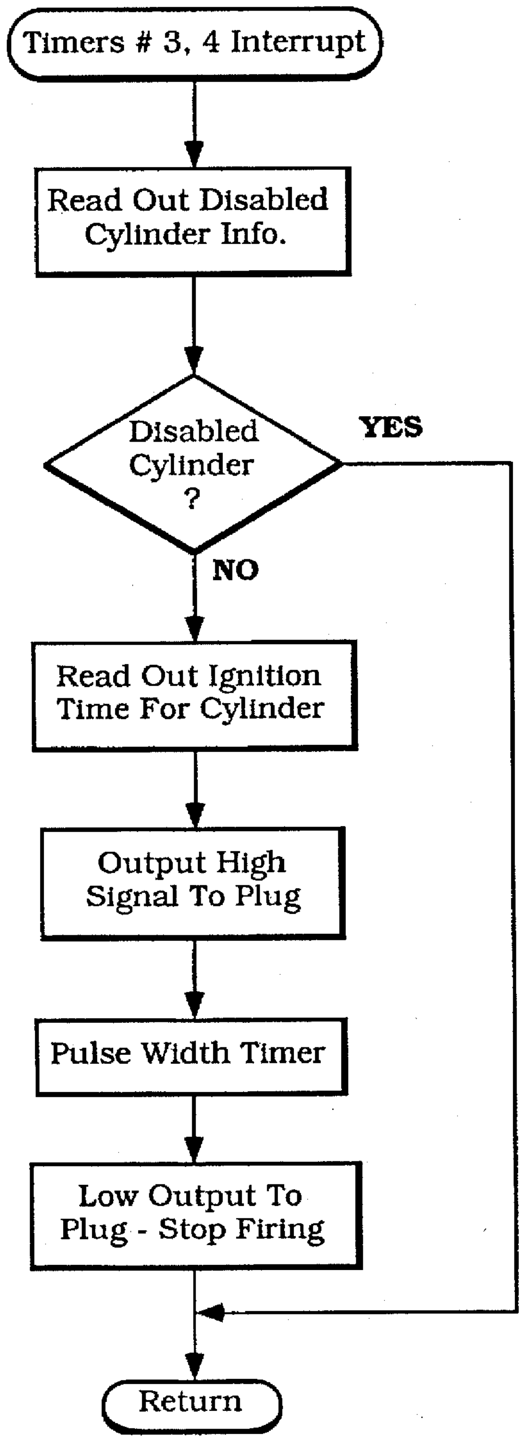
FIG. 12 is a block diagram showing more details of the control routine during cylinder disabling.

FIG. 12 shows the arrangement for controlling the condition when cylinders are disabled. This program starts out by reading the interruption phases from the pulses of the individual cylinders at timers #3 and #4. The program then moves to the next step to read out the disabled cylinder information and identify the cylinder which is being disabled. The program then moves to the next step to see if the cylinder in question is the cylinder which is being disabled. If so, the program moves to return. If, on the other hand, the cylinder is not a disabled cylinder, then the program moves to the step to read the ignition output for that cylinder and determine the timing interval.

The program then moves to the next step to output a high pulse to the spark coil for that cylinder to effect its sparking.

The program then moves to the next step to set the pulse width timer for the duration of the plug firing, and finally to the step when the ignition output port is returned to the low value and ignition is discontinued.

Figure 13:
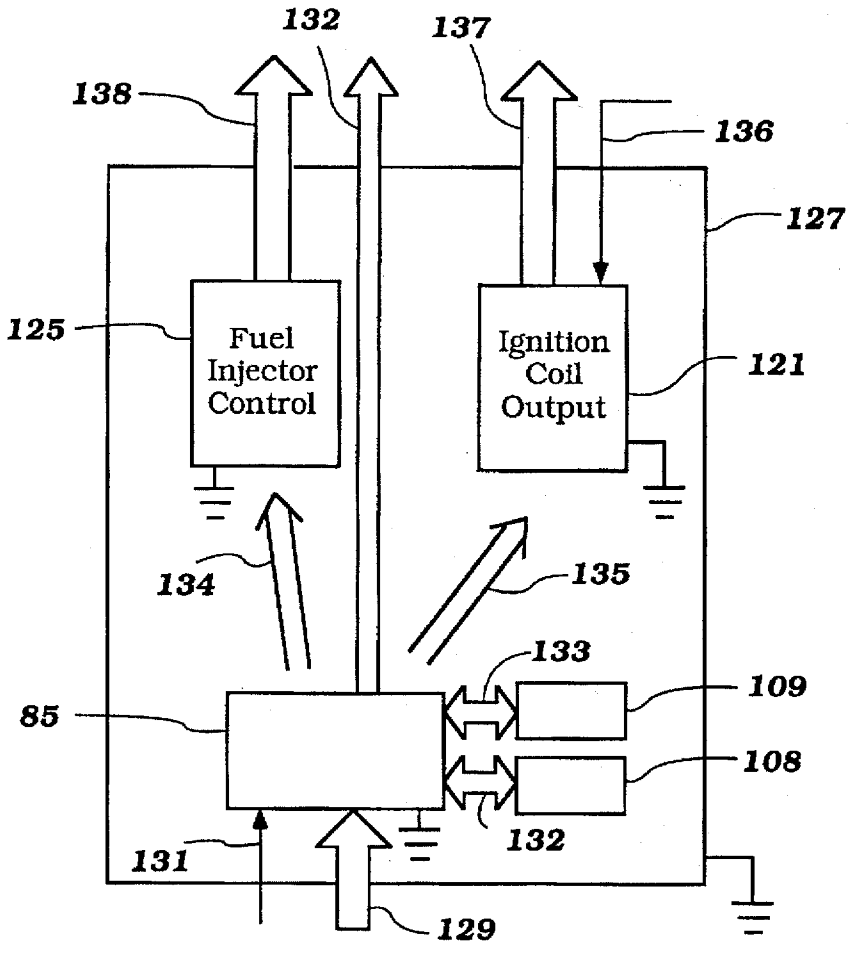
FIG. 13 is a partially schematic, elevational view showing the control elements as mounted on their printed circuit board and as potted thereon.

Having described generally the basic concept by which basic engine running control is accommodated, the reader should have sufficient background to understand the facets involving the basic control. As has been already noted, the invention relates not to the specific control routine or routines utilized but rather to the mounting and packaging of the control mechanism and its relation to the controlled components. The entire control assembly which forms the subject of this invention is indicated generally by the reference numeral 127 and is shown schematically in FIG. 13, while the actual construction is shown in cross-section in FIG. 14.

Basically, the control panel 127 includes a substrate 128 onto which the ECU 85 is mounted with the appropriate electrical connections being made through strips on the substrate 128 as is known in this art. The ECU 85 receives input signals in a manner to be described in more detail later from the various sensors as shown in FIG. 4 through wire connectors shown schematically in FIG. 13 by the reference numeral 129. In addition, electric power is delivered from the battery or a power source as indicated by the line 131.

The connections between the volatile memory 108 and the nonvolatile memory 109 and the ECU 85 are shown by the arrows 132 and 133. These also are formed by conductive strips mounted on the substrate 128.

The ECU outputs its control signals to the fuel injector control 125 previously described by reference to FIG. 5 through an output indicated schematically at 134. In a similar manner, the ECU 85 outputs its control signals to the ignition coil outputs 121, also described by reference to FIG. 5 previously, as indicated schematically at 135.

A power wire for the ignition coil output is indicated at 136 and the ignition coil output signal is indicated at 137. The fuel injector output is indicated schematically at 138. In addition to these outputs, electrical power is outputted from the ECU as indicated at 139 for various things such as the oil pump control and the fuel pump controls as also have been previously noted.

Figure 14:
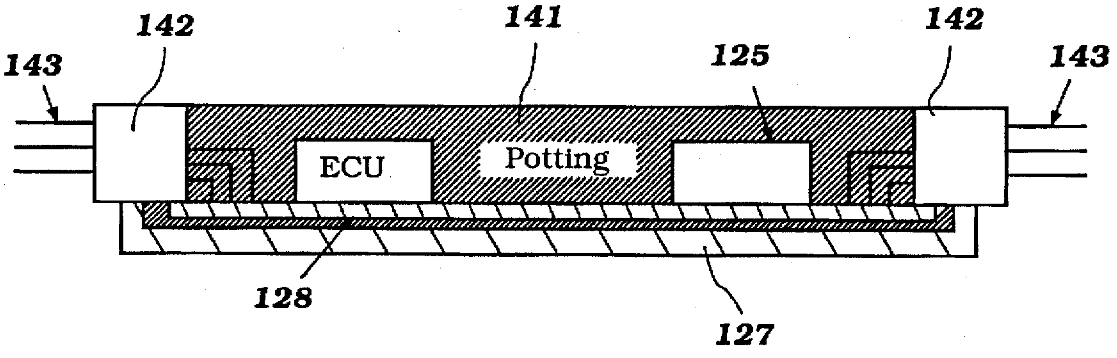
FIG. 14 is a cross-sectional view taken through a portion of the control box.

Referring now in more detail to FIG. 14, the ECU 85, as has been noted, is mounted on the substrate 128. Also mounted on the substrate 128 are the fuel injector control 125, which appears in FIG. 14, and the ignition coil output 121, which does not appear in this figure. The ECU 85, fuel injector control 125 and ignition coil output 121 are positioned as space locations from each other so as to minimize electrical interference there between. In addition, these circuits are all mounted in a suitable potting compound, indicated at 141, such as any of the resins normally used for this purpose. This poring provides shock resistance and further electrical noise resistance.

Mounted on the substrate 128 at space locations are electrical connectors 142 to which respective wire harnesses 143 are connected for conveying electrical power to and from the various control components and sensors and inputs and outputs.

Figure 15:
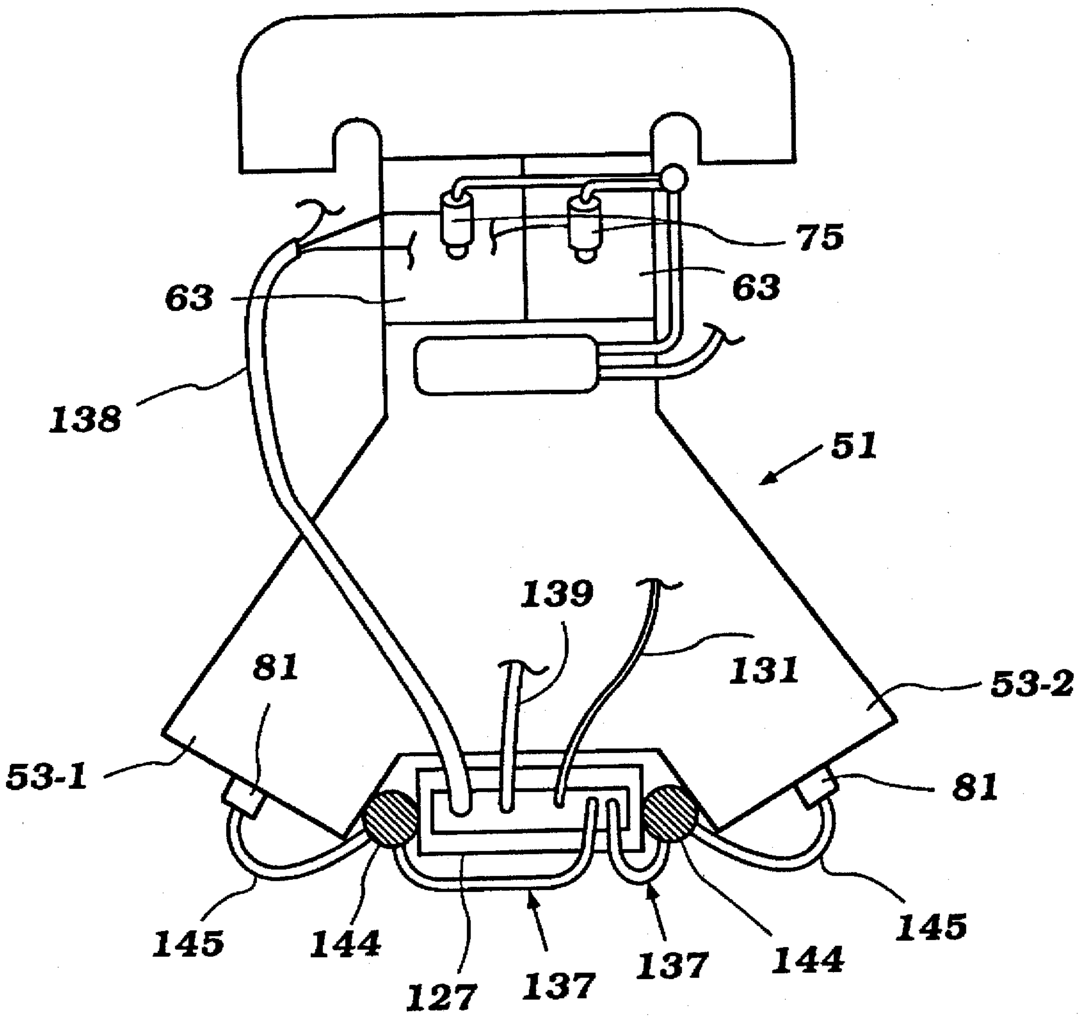
FIG. 15 is a partially schematic top plan view showing how the control box is mounted on the engine and how certain of the electrical leads to and from the control box are located.
Figure 16:
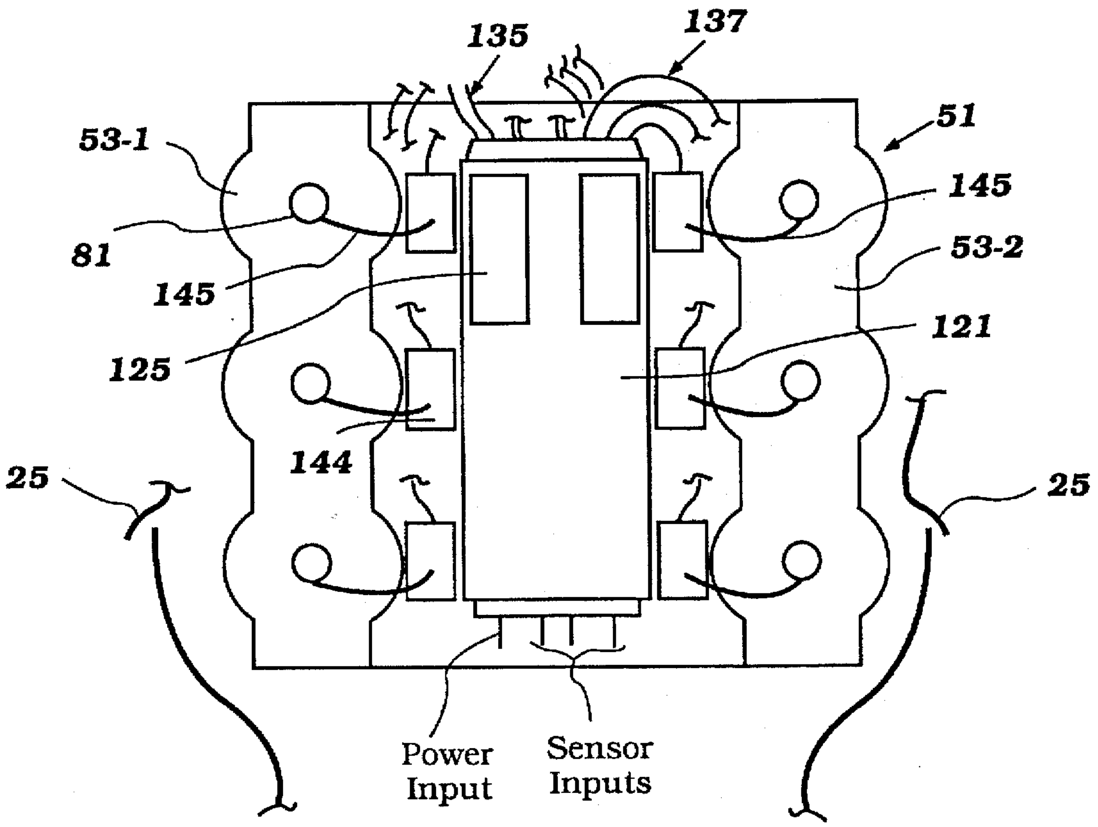
FIG. 16 is a rear elevational view of the engine and control box arrangement as shown in FIG. 15.

FIG. 15 shows conveniently how the control box 127 can be mounted on the engine 51. The engine mounting also appears in FIG. 16 wherein the protective cowling 25 is also partially shown so as to facilitate understanding of the flame of reference.

As has been previously noted, the engine 51 is of the V-type and thus is provided with a pair of angularly related cylinder banks which include the respective cylinder heads 53-1 and 53-2 for each bank. These cylinder heads and banks form a valley and the control box 127 is conveniently mounted in this valley.

Mounted on opposite sides of the control box 157 or in proximity thereto are individual spark coils 144, one for each of the spark plugs 81. Wires, indicated at 137 extend from the ignition coil output 127 of the control box 157 and go to each of the spark coils 144. Spark plug leads 145 then lead from each spark coil to the individual spark plugs 81 for firing the spark plugs in a known manner.

In a similar manner, the wire harness 138 extends from the fuel injection control 125 to the individual fuel injectors 75 for powering their solenoid coils and, accordingly, effecting the discharge of fuel therefrom. Thus, the assembly is quite compact but the sensor inputs and power input and output are spaced from each other and the individual circuit components are spaced from each other and protected by the potting compound 141 so as to avoid electrical noise, heat transfer and malfunctions which might result therefrom.

Figure 17:
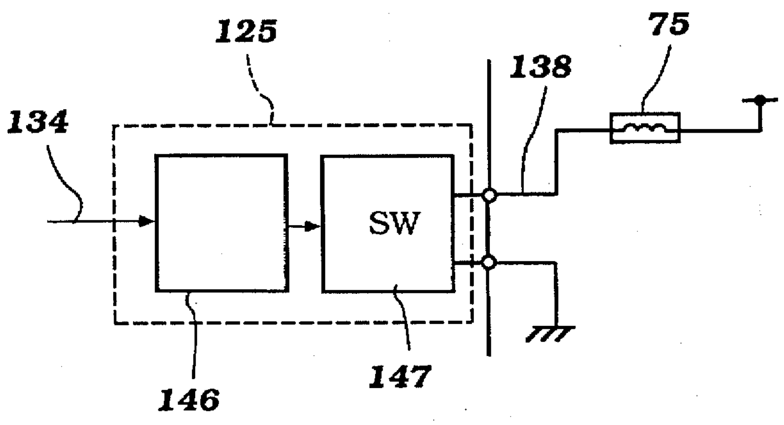
FIG. 17 is a partially schematic view of the injection system.

FIG. 17 is a schematic view showing how the injection control circuit 125 is actually formulated. It includes a semi-conductor switch drive circuit, indicated schematically at 146 which, in ram, operates a semi-conductor switch 147 such as a SCR or the like and which outputs it signals through the wire harness 138 to the solenoid windings of the fuel injector 75.

Figure 18:
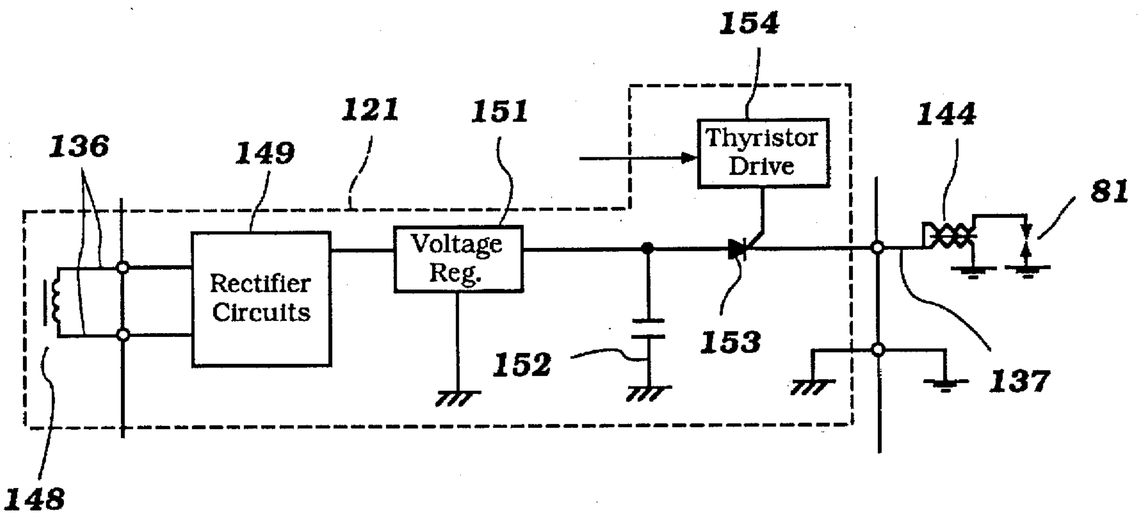
FIG. 18 is a partially schematic view of the ignition system.
Figure 19:
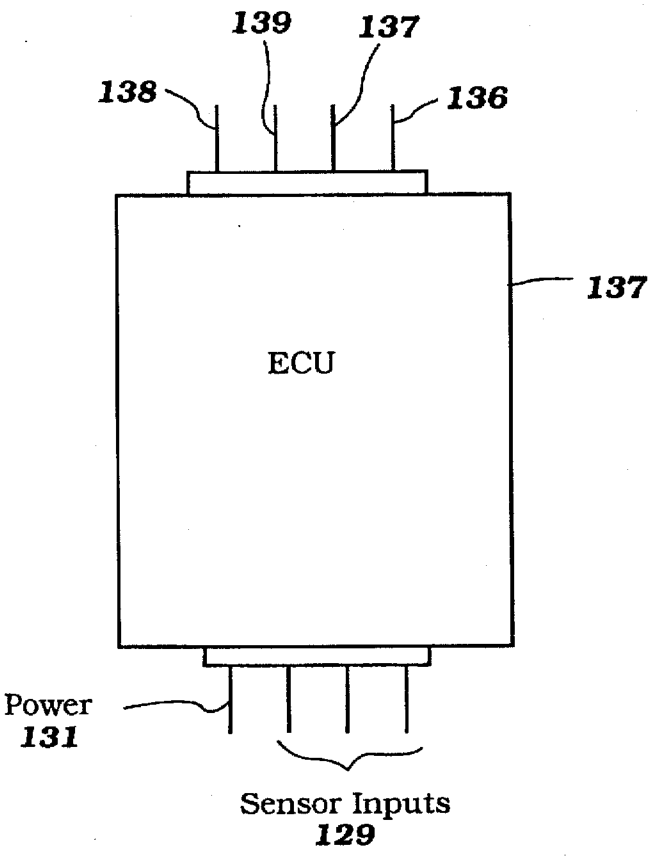
FIG. 19 is a view showing the control box and various electrical connections associated with it.

The ignition circuit is shown schematically in FIG. 18 and specifically the ignition coil output circuit 121. This receives electrical power from the conductors 136 from a charging coil 148. This electrical power is then transferred to a rectifier circuit 149 which, in turn, outputs the signal to a voltage limiting circuit 151. The controlled voltage is then impressed on a condenser 152 of a capacitor discharge-type ignition circuit. A controlling ignition thrysistor 153 has its conductivity changed by a drive circuit 154 which then outputs the signal to the harness 137 for the individual spark coils 144 for firing of the spark plugs 81 in a known manner.

Thus, it should be apparent from the foregoing description that the described control is not only compact and easily mounted in the confined condition of the outboard motor, but is also relatively insensitive to electrical noise. Of course, the foregoing description is that of a preferred embodiment of the invention and various changes and modifications may be made without departing from the spirit and scope of the invention, as defined by the appended claims.

We claim:

1. A control arrangement for an internal combustion engine having at least one fuel injector for injecting fuel for combustion in a combustion chamber and at least one spark plug for firing the charge in that combustion chamber, said engine control arrangement comprising a substrate, an ignition control circuit mounted on said substrate at a first location thereon, an injection control circuit mounted on said substrate at a second location spaced from the said first location, and a potting compound containing said ignition control circuit and said fuel injection control circuit, and a plurality of conductors for transmitting control signals to said circuits and for transmitting control signals from said circuits to the fuel injector and the spark plug.

2. A control arrangement for an internal combustion engine as set forth in claim 1, wherein the engine is comprised of the V-type engine having a pair of inclined cylinder banks each having a plurality of fuel injectors and spark plugs for said banks and wherein the control arrangement is mounted in the valley between said cylinder banks.

3. A control arrangement for an internal combustion engine as set forth in claim 2, wherein the fuel injection control circuit is disposed adjacent one of the cylinder banks and the ignition control circuit is disposed adjacent the other of the cylinder banks.

4. A control arrangement for an internal combustion engine as set forth in claim 1, wherein the power supply conductors are spaced from the signal supply conductors and from the sensors conductors.

5. A control arrangement for an internal combustion engine as set forth in claim 4, wherein the engine is comprised of the V-type engine having a pair of inclined cylinder banks each having a plurality of fuel injectors and spark plugs for said banks and wherein the control is mounted in the valley between said cylinder banks.

6. A control arrangement for an internal combustion engine as set forth in claim 5, wherein the fuel injection control circuit is disposed adjacent one of the cylinder banks and the ignition control circuit is disposed adjacent the other of the cylinder banks.

* * * * *